US009354123B2

(12) United States Patent
Drouin et al.

(10) Patent No.: US 9,354,123 B2
(45) Date of Patent: May 31, 2016

(54) SYSTEMS AND METHODS FOR PROCESSING TEMPERATURE DATA OR OTHER SIGNALS (71) Applicants: Mathew Drouin, Manchester, NH (US); Devon Fernandez, Londonderry, NH (US); William P. Taylor, Amherst, NH (US)

(72) Inventors: Mathew Drouin, Manchester, NH (US); Devon Fernandez, Londonderry, NH (US); William P. Taylor, Amherst, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 538 days.

(21) Appl. No.: 13/727,114

(22) Filed: Dec. 26, 2012

(65) Prior Publication Data
US 2014/0177674 A1 Jun. 26, 2014

(51) Int. Cl.
*G01K 7/00* (2006.01)
*G01N 25/00* (2006.01)
*G01K 7/01* (2006.01)
*G01R 35/00* (2006.01)
*G01D 3/036* (2006.01)
*G01R 33/00* (2006.01)

(52) U.S. Cl.
CPC ............... *G01K 7/01* (2013.01); *G01D 3/0365* (2013.01); *G01K 7/00* (2013.01); *G01R 33/0029* (2013.01); *G01R 33/0041* (2013.01); *G01R 35/005* (2013.01)

(58) Field of Classification Search
USPC .................................... 374/45, 178, 170, 163
See application file for complete search history.

(56) References Cited

U.S. PATENT DOCUMENTS

| 4,820,981 A * | 4/1989 | Bussiere | G01R 33/123 324/222 |
|---|---|---|---|
| 6,270,463 B1 * | 8/2001 | Morris, Sr. | G01K 1/024 374/E1.004 |
| 2005/0258821 A1 | 11/2005 | Wang et al. | |

(Continued)

FOREIGN PATENT DOCUMENTS

WO    WO 2006/056829 A1    6/2006

OTHER PUBLICATIONS

PCT International Preliminary Report on Patentability and Written Opinion of the ISA dated Jul. 9, 2015; for PCT Pat. App. No. PCT/US2013/071183; 7 pages.

(Continued)

Primary Examiner — Mirellys Jagan
(74) Attorney, Agent, or Firm — Daly, Crowley, Mofford & Durkee, LLP (57) ABSTRACT In an embodiment, a circuit is configured to produce a magnetic field signal having a frequency spectrum. The circuit may also produce a temperature signal. A modulation circuit may modulate the temperature signal with a frequency outside the frequency spectrum of the magnetic field signal. The modulated signal and the magnetic field signal may be combined to produce a combined signal. A separation circuit may be configured to separate component signals from the combined signal. The separation circuit may include a first filter, which, when applied to the combined signal, produces a filtered signal; a modulation circuit configured to shift the data representing the temperature signal to a baseband frequency; and a second filter configured to separate the data representing the temperature signal from the combined signal.

25 Claims, 8 Drawing Sheets

(56) References Cited

U.S. PATENT DOCUMENTS

| | | |
|---|---|---|
| 2006/0039445 A1 | 2/2006 | McLeod |
| 2007/0247141 A1 | 10/2007 | Pastre et al. |
| 2012/0086442 A1 | 4/2012 | Haas et al. |
| 2012/0203470 A1 | 8/2012 | Bitter et al. |
| 2014/0177674 A1* | 6/2014 | Drouin ............... G01D 3/0365 374/178 |

OTHER PUBLICATIONS

PCT Search Report and Written Opinion of the ISA dated Mar. 12, 2014; for PCT Pat. App. No. PCT/US2013/071183; 10 pages.

Response filed on Feb. 25, 2016 to the Office Action dated Aug. 21, 2015; for European Pat. App. No. 13811281.8; 15 pages.

* cited by examiner

SYSTEMS AND METHODS FOR PROCESSING TEMPERATURE DATA OR OTHER SIGNALS

FIELD

Subject matter disclosed herein relates generally to integrated circuits and, more particularly, to techniques and circuits for processing temperature signals.

BACKGROUND

The operation of integrated circuits (ICs) is often affected by temperature. Integrated circuits, especially analog circuits, may perform differently when subjected to high and low temperature. For example, a magnetic field sensor IC installed in an automobile may operate differently when the car is first started on a cold winter day, and when the automobile has been running long enough for the motor or transmission to heat the IC.

Many ICs incorporate temperature sensors that can measure temperature. The temperature measurement can be used to tune the IC circuitry, or to compensate for effects caused by temperature in signals produced by the IC. However, incorporating circuitry for measuring temperature into the IC can require additional analog and digital components to be designed into the IC. This can be inconvenient and expensive, and can consume space on the die of the IC.

SUMMARY

In an embodiment, a circuit is configured to produce an magnetic field signal. The magnetic field signal may have a frequency spectrum and may be responsive to a magnetic field external to the circuit. The circuit may also be configured to produce a temperature signal.

The circuit may include a first modulation circuit configured to modulate the temperature signal with a frequency outside the frequency spectrum of the magnetic field signal, resulting in a first modulated signal. The first modulated signal and the magnetic field signal may be combined to produce a combined signal.

The circuit may include a separation circuit for separating or isolating component signals from the combined signal. The separation circuit may include a first filter, which, when applied to the combined signal, produces a filtered signal; a modulation circuit configured to shift the data representing the temperature signal to a baseband frequency; and a second filter configured to separate the data representing the temperature signal from the combined signal.

BRIEF DESCRIPTION OF THE DRAWINGS

The foregoing features may be more fully understood from the following description of the drawings in which.

Unless specifically noted, like numbers in the drawings may represent like elements.

DETAILED DESCRIPTION

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

Magnetic field sensors often include driver circuits that can drive an output signal of the magnetic field sensor. These driver circuits often produce a digital or analog output signal that alternates between a high and low signal level when the magnetic field sensor senses a magnetic target. In some cases, depending upon the location where the magnetic field sensor is installed, the driver circuit may have to drive the output signal across a long wire or cable harness. For example, if the magnetic field sensor is installed in a vehicle's transmission (e.g. on a camshaft), the wire harness running from the magnetic field sensor to a central processor may be a few feet or a few meters in length.

Figure 1:
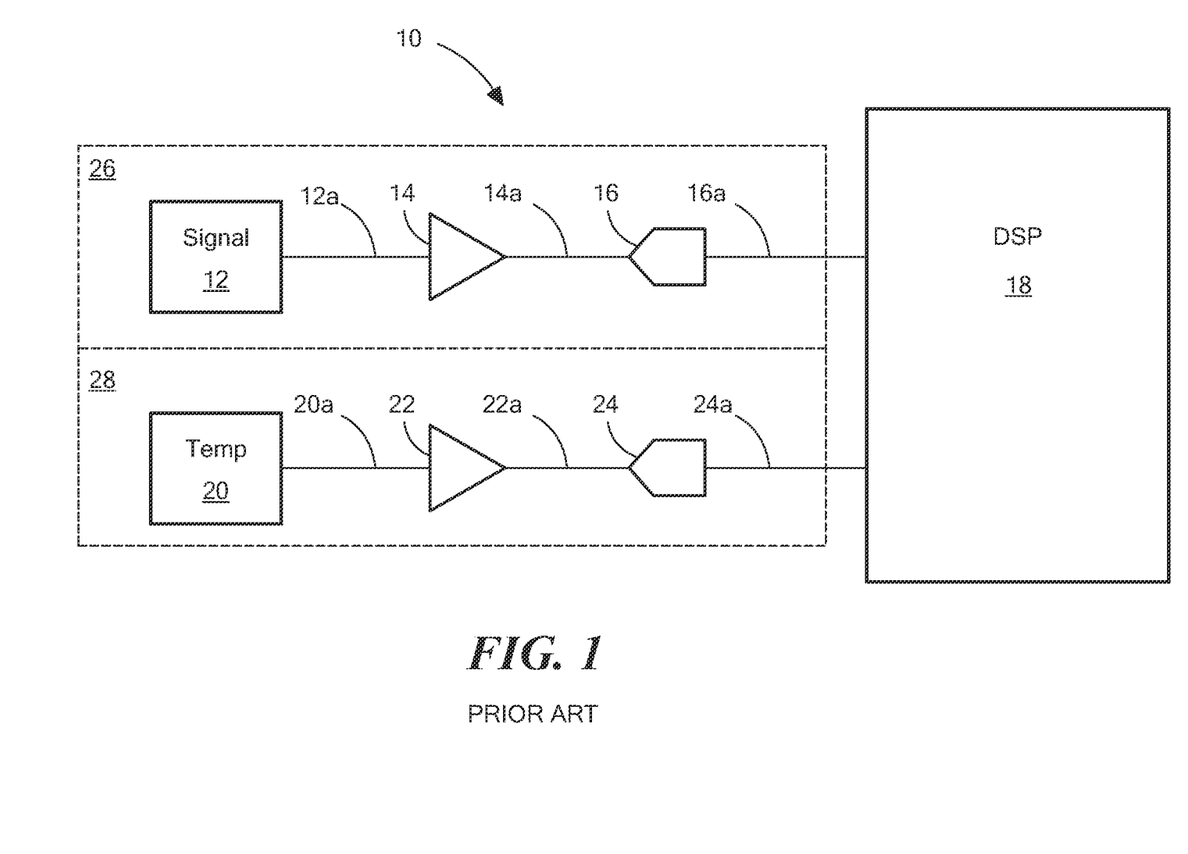
FIG. 1 is a block diagram illustrating a conventional output driver circuit of the prior art.

FIG. 1 is a block diagram of an electronic circuit 10 of the prior art. The electronic circuit 10 may include a signal circuit 12 that produces a signal 12a. The signal 12a may be received by an amplifier 14, which may produce an amplified signal 14a. The amplified signal 14a may be received by an analog-to-digital converter (ADC) 16, which may produce a digital signal 16a. A digital signal processor 18 receives the digital signal 16a for subsequent processing.

The electronic circuit 10 may also include a temperature circuit 20 that produces a temperature signal 20a. The temperature signal 20a may represent a temperature reading made by the temperature circuit 20. An amplifier 22 may receive the temperature signal 20a and produce an amplified temperature signal 22a. An ADC 24 may be coupled to receive the amplified temperature signal 22a and convert it to a digital temperature signal 24a. The digital temperature signal 24a may be received by the DSP 18 for subsequent processing.

As shown, the electronic circuit 10 includes a signal path 26 and a temperature signal path 28, each having redundant hardware. For example, each signal path 26 and 28 includes an amplifier and an ADC. In operation, the hardware included in the signal path 26 ultimately produces a digital signal 16a that is received by the DSP 18, and the hardware included in the temperature signal path 28 produces a digital temperature signal 24a that is also received by the DSP 18. The digital temperature signal 24a may be used by the electronic circuit 10 for calibration, cooling or heating algorithms, or any other purpose.

Although not shown, the electronic circuit may also include other signal paths similar to the signal path 26 or the temperature signal path 28. These other signal paths may also include amplifiers or ADC circuits, and may also produce digital signals that can be received by the DSP 18.

Figure 2:
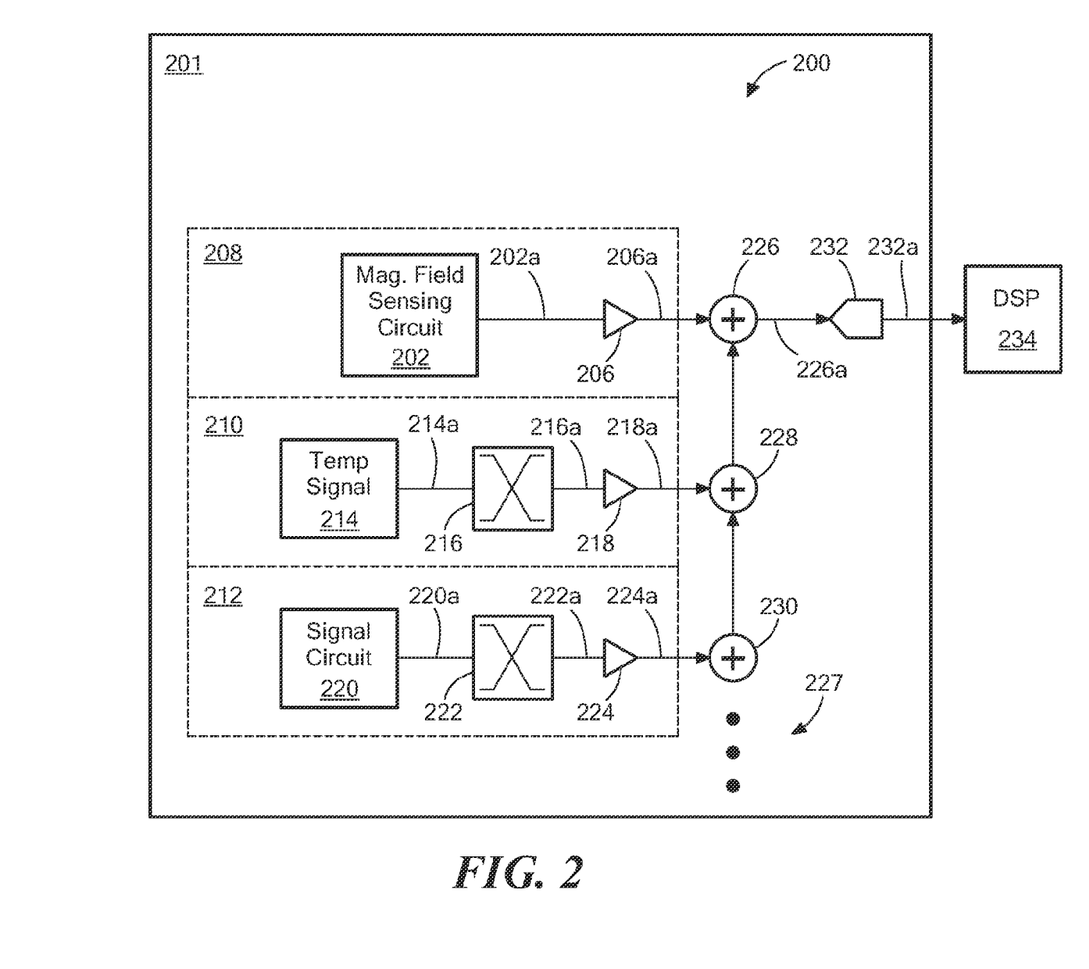
FIG. 2 is a block diagram of an electronic circuit for combining and extracting signals.

FIG. 2 is a block diagram of an electronic circuit 200 for processing signals. The electronic circuit 200 may be included as part of an integrated circuit (IC) 201. The IC 201 may, in an embodiment, be a magnetic field sensor for detecting an external magnetic field. Such an IC 201 may be installed in a vehicle to detect, for example, the speed, direction, and position of a camshaft, or of another part of the vehicle's transmission.

As is known in the art, circuits installed in a vehicle may be subject to large temperature swings. Cold weather may cool the electronic circuit to below-freezing temperatures, and operation of the vehicle's engine and transmission can heat the electronic circuit to temperatures above two hundred fifty degrees Fahrenheit. Such wide temperature swings can affect the operation of the electronic circuit 200. If, for example, the IC 201 is a magnetic field sensor that contains circuits with temperature dependencies, the circuits may perform differently in a cold environment than in a hot environment. For example, if the IC 201 contains components such as Hall effect sensing elements or GMR sensing elements, such large swings in temperature may affect the output of those components, which could affect accuracy of the magnetic field detection.

To compensate for such temperature effects, the electronic circuit 200 may include circuitry to measure temperature. The temperature measurements can be used to calibrate or the electronic circuit 200, or to compensate for temperature effects in signals produced by the electronic circuit. The electronic circuit 200 may also include other circuitry to measure signals such as humidity, location, stress and strain, etc.

The electronic circuit 200 may include a magnetic field sensing circuit 202 that produces a baseband signal 202a. In an embodiment, the magnetic field sensing circuit 202 may include a magnetic field sensing element (not shown) and the baseband signal 202a may represent the presence of a magnetic target sensed by the magnetic field sensing element. As described above, the magnetic target may be a magnetic element, such as a tooth of a gear or toothed wheel.

The baseband signal 202a may be an analog signal (AC or DC) or switched signal (e.g. a binary signal based on the design of the magnetic field sensing circuit 202. An analog signal may have a magnitude that corresponds to the strength of a sensed magnetic field, and a switched signal may transition between a logic high level and a logic low level as a magnetic target is sensed by the magnetic field sensing circuit 202. Also, since the baseband signal 202a may have a frequency based on the frequency of a magnetic target, e.g. a rotation rate of a rotating target. Accordingly, the baseband signal 202a produced by the magnetic field sensing circuit 202 may have a frequency spectrum responsive to the sensed magnetic target.

The magnetic field sensing circuit 202 includes a magnetic field sensing element (not shown). For embodiments in which the magnetic field sensing circuit 202 includes a Hall Effect element, the magnetic field sensing circuit 202 can also include a chopping circuit (not shown). Chopping is a known technique in which a Hall Effect element is driven in a plurality of so-called phases. In each phase, a drive voltage or drive current is coupled to particular nodes of the Hall Effect element, which node couplings change in each phase. In each phase, an output signal is received from other particular nodes the Hall Effect element, which node couplings also change in each phase.

Chopping is described for example, in U.S. patent application Ser. No. 12/845,115, entitled "Magnetic Field Sensor with Improved Differentiation Between a Sensed Magnetic Field and a Noise Signal, and filed Jul. 10, 2010, which application is assigned to the assignee of the present invention, and which is incorporated herein by reference in its entirety.

Chopping is most often used to remove a DC offset signal from the Hall Effect element signal, e.g., the baseband signal 202a. In one form of chopping, also referred to herein as offset modulation, a part of the signal generated by the Hall effect element that is representative of a sensed magnetic field remains at baseband, and an offset signal portion is shifted to a higher frequency in accordance with a chopping frequency. In another form of chopping, also referred to herein as signal modulation, the offset signal part of the signal generated by the Hall effect element remains at baseband, and the signal portion that is representative of a sensed magnetic field is shifted to a higher frequency in accordance with the chopping frequency.

It can be assumed that chopping, when provided, is offset modulation chopping, and the signal representative of a sensed magnetic field remains at baseband. However, it should be understood how the circuits described herein can be modified to be used with signal modulation chopping.

For embodiments in which the magnetic field sensing element is not a Hall Effect element, for example, a magnetoresistance element, the chopping circuit can be omitted from the magnetic field sensing circuit.

The electronic circuit 200 may also include an amplifier 206 that receives the baseband signal 202a, amplifies it, and produces and amplified signal 206a.

The magnetic field sensing circuit 202, chopping circuit (not shown), and amplifier 206 may comprise a magnetic field sensing signal path 208. In an embodiment, the magnetic field sensing signal path 208 senses a magnetic field and produces the amplified signal 206a as an output. In alternate embodiments, the chopping circuit 204 and the amplifier 206 may be optionally omitted from the magnetic field sensing signal path 208, so long as the magnetic field sensing signal path 208 can produce an output representative of the sensed magnetic field.

The electronic circuit 200 may also include one or more additional signal paths, such as temperature signal path 210, and signal path 212, etc. The temperature sensing signal path 210 may include a temperature sensing circuit 214 which produces a temperature signal 214a. The temperature signal circuit 214 may include circuitry to measure temperature such as a temperature sensitive diode or transistor, a PN junction, a junction of a BJT transistor, a digital thermometer, etc. The temperature signal 214a may be an analog or digital signal representing a temperature measurement taken by the temperature signal circuit 214.

In an embodiment, the temperature signal circuit 214 may be part of a circuit that is not specifically designed to measure temperature. For example, assume the IC 201 includes an amplifier circuit (or any other type of circuit) having a PN junction (e.g. a junction within a diode or BJT transistor). The electronic circuit 200 may include other circuits to drive and measure current through the PN junction while the amplifier is not operational in order to measure temperature. This can reduce the need for an additional circuit dedicated solely to measuring temperature.

The temperature signal path 210 may also include a modulator circuit 216 that receives the temperature signal 214a and produces a modulated temperature signal 216a. The modulator circuit 216 may modulate the temperature signal 214a, which may modulate, i.e. shift the frequency, of the temperature signal 214a with another frequency, e.g. a frequency f2, as will be discussed below.

The temperature signal path 210 may also include amplifier 218 coupled to receive the modulated temperature signal 216a and produce an amplified temperature signal 218a. In an embodiment, depending upon design requirements, the amplifier 218 may be coupled between the temperature signal circuit 214 and the modulator 216, or may be omitted from the temperature signal path 210.

The electronic circuit 200 may also include other signal paths, such as signal path 212. The signal path 212 may include a signal circuit 220 which produces a signal 220a. The signal path 212 may also include a modulation circuit 222 coupled to receive the signal 220a. The modulation circuit 222 may modulate, i.e. shift the frequency, of the signal 220a to a different frequency, as will be discussed below.

The signal path 212 may also include an amplifier 224 coupled to receive a modulated magnetic field signal 222a from the modulation circuit 222. The amplifier 224 may amplify the modulated magnetic field signal 222a and produce an amplified magnetic field signal 224a. In an embodiment, depending upon design requirements, the amplifier 224 may be coupled between the signal circuit 220 and the modulator 222, or may be omitted from the signal path 212.

In an embodiment, the signal circuit 220 may be a second magnetic sensor circuit, also configured to detect a magnetic field and produce a signal representing parameters of the magnetic field. For example, if the IC 201 is a magnetic sensor IC, the magnetic field sensing circuit 202 may detect a magnetic field in a first direction, and the signal circuit 220 may detect a magnetic field in a second, perpendicular direction. By detecting orthogonal magnetic fields, the IC 220 may be able to measure the magnetic field in two or more dimensions.

As indicated by the ellipsis 227, the electronic circuit 200 may include additional signal paths. Such signal paths may be configured to measure stress or strain on part a substrate of the IC 201, measure humidity, measure oil pressure, measure transmission error conditions, or produce any other type of signal that can be modulated with a desired frequency. In an embodiment, each of the additional signal paths may modulate the measured signal to a desired or predetermined frequency.

In embodiments, the baseband signal 202a may contain information in more than one frequency band. In such instances, the modulators 216, 212 may modulate the signals 214a and 22a, respectively, with frequencies that fall between the frequency bands of the baseband signal 202a.

The electronic circuit 200 also includes one or more adder circuits 226, 228, and 230. The adder circuits 226, 228, and 230 are configured to receive the output signals from the signal paths 208, 210, and 212 and combine them into a combined signal 226a. The adder circuits 226, 228, and 230 may be voltage adders, current adders, or any other type of circuit that can combine signals together to create a combined signal. The electronic circuit 200 may also include additional adder circuits for additional signal paths, as indicated by the ellipsis 226.

As shown in FIG. 2, the adder circuits 226, 228, and 230 may be analog circuits that add or combine analog signals to produce a combined analog signal 226a. In other embodiments, the signal paths 208, 210, and 212 may produce digital output signals, and the adder circuits may be digital adder circuits that produce a digital output signal 226a that comprises the digital output signals from the signal paths 208, 210, and 212.

In an embodiment, instead of a series of adder circuits 226, 228, and 230, the electronic circuit may include a single adder circuit having a sufficient number of inputs to accommodate all the outputs from the signal paths. In such an embodiment, the signal adder circuit may still produce a combined signal 226a that comprises a summation or combination of the output signals of the signal paths in the electronic circuit 200.

In an embodiment, the electronic circuit 200 may also include an ADC 232 that receives the combined signal 226a and converts it to a digital signal 232a for subsequent processing by a digital signal processor 234. In another embodiment, if the combined signal 226a is a digital signal, the ADC 232 can be omitted.

The digital signal 232a may be received by a digital signal processor (DSP) 234. The DSP 234 may be an external DSP, as shown. For example, if the IC 201 is a magnetic field sensor installed in a vehicle, the DSP 234 may be included as part of a central processor of the vehicle. In another embodiment, the DSP 234 may be included within the IC 201 (not shown). In such an embodiment, the DSP 234 may be part of the integrated circuit 201, or may be a separate integrated circuit, i.e. upon a separate substrate, within the same package as the IC 201. The DSP 234 may be configured or programmed to perform operations on the combined digital signal 232a, which are discussed below.

In another embodiment, the DSP 234 may be omitted and replaced by analog circuitry for processing the combined signal. Of course, in such an embodiment, the ADC 232 may also be omitted so that the signal received by the processing circuitry is an analog signal.

As described above, the magnetic field sensing circuit 202 may include a magnetic field sensing element that measures parameters (such as strength) of a magnetic field, and the baseband signal 202*a* may represent those parameters. The amplified signal 206*a* may include a baseband signal that represents the parameters of the magnetic field, i.e. that is responsive to a magnetic field.

The temperature sensing circuit 214 may take temperature measurements and produce a temperature signal 214*a*. The temperature signal 214 may be a DC signal or have a very low frequency if the temperature measurements are relatively stable or unchanging. In this case, the temperature signal 214*a* will also be a baseband signal. If both the temperature signal 214*a* and the baseband signal 202*a* are baseband signals and are combined, then data contained in the signals could be lost if the frequencies of the signals overlap. Accordingly, the modulator circuit 216 may modulate the temperature signal 214*a* in order to generate a modulated signal 216*a* that has a different frequency band. In an embodiment, the modulated signal 216*a* may have a frequency band that is twice the expected frequency of the signal 206*a* so that, when combined, the frequency band of the modulated temperature signal 216*a* does not overlap with the frequency of the signal 206*a*.

Similarly, the signal circuit 220 may take measurements and produce a signal 220*a*. The signal 220*a* may also be a baseband signal. Accordingly, the modulation circuit 222 may modulate the signal 220*a* with a frequency so that the modulated signal 222*a* does not overlap in frequency with either the modulated signal 216*a* or the baseband signal 202*a*.

Figure 3A:
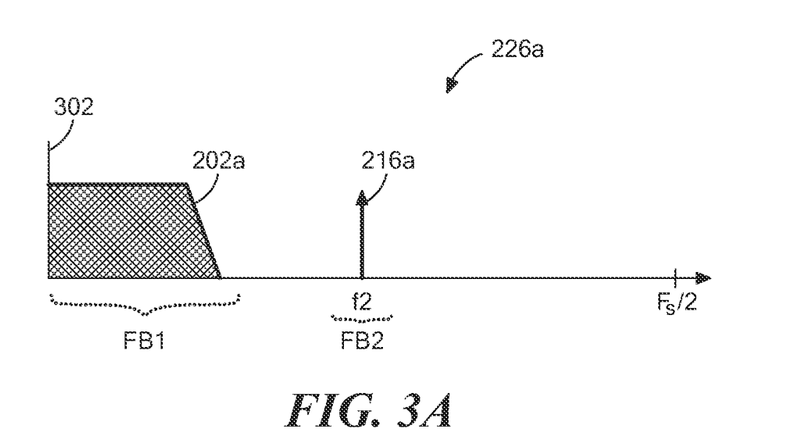
FIG. 3A is a graph of a frequency spectrum of a combined signal.

FIG. 3A is a frequency spectrum of an example of the combined signal 226*a*. In FIG. 3A, the horizontal axis represents frequency and the vertical axis represents voltage. An arrow 302 represents the point on the spectrum where the frequency is zero.

As shown, the combined signal 226*a* includes a baseband block. The block may represent the frequency band of the baseband signal 202*a*. As discussed above, if the IC 201 is a magnetic field sensor, the baseband signal 202*a* may be a signal representing a parameter of a sensed magnetic field. Accordingly, the block 202*a* may represent the frequency band of the magnetic field signal.

The combined signal 226*a* may also include the modulated temperature signal 216*a*. As shown, the modulated temperature signal 216*a* may be modulated to a frequency (e.g. frequency f2) that is outside of and does not overlap the frequency band of the baseband signal 202*a*. One skilled in the art will recognize that, although the modulated temperature signal 216*a* is shown as a single frequency on the spectrum, the modulated temperature signal 216*a* may have a wider frequency bandwidth and thus may include sidebands. Although the temperature signal 216*a* may have a wider frequency band than what is shown in FIG. 3A, the modulation circuit 216 may be configured so that the frequency band of the modulated temperature signal 216*a* does not overlap with the frequency band of the baseband signal 202*a*.

Figure 3B:
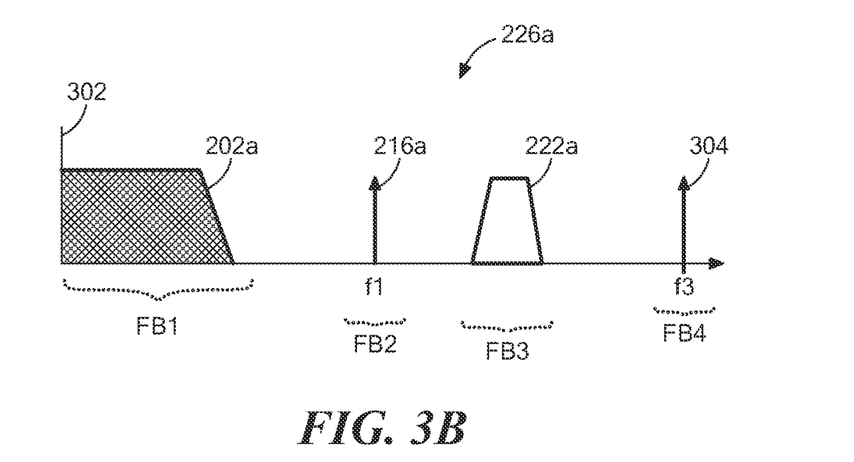
FIG. 3B is a graph of a frequency spectrum of a combined signal.

FIG. 3B is a frequency spectrum of another example of the combined signal 226*a*. In FIG. 3B, the horizontal axis represents frequency and the vertical axis represents voltage. The arrow 302 represents a frequency of zero.

The combined signal 226*a* shown in FIG. 3B includes a block representing the frequency band of the baseband signal 202*a* as well as an arrow representing the modulated temperature signal 216*a*, as described above. In FIG. 3B, however, the combined signal 226*a* may also include the modulated magnetic field signal 222*a* generated by the signal circuit 220 and modulated by the modulator 222. The modulator 222 may be configured to modulate the signal 220*a* to a frequency band that does not overlap the frequency band of the baseband signal 202*a* or the temperature signal 216*a*. As shown, the signal 222*a* may have a relatively wide bandwidth, as shown by the sidebands (i.e. the relatively wide shape) of the modulated magnetic field signal 222*a*. However, in an embodiment, the signal 222*a* can be a narrowband spectral line (e.g. a DC signal).

As shown in FIG. 3B, the baseband signal 202*a* falls primarily within a frequency band FB1. Similarly, the temperature signal 216*a* may be modulated so that the frequency spectrum of the temperature signal 216*a* falls primarily within a frequency band FB2, and the signal 222*a* may be modulated so that it falls within a frequency band FB3.

A signal 304 may be a measurement signal generated and modulated by an additional signal path within the electronic circuit 200. In another embodiment, the signal 304 may be an artifact of the baseband signal 202*a*. For example, for embodiments described above where the magnetic field circuit 202 provides offset modulation chopping, the signal 304 may be indicative of a DC offset of the baseband signal 202*a* that has been shifted to a higher frequency f3 by the chopping operation. Although not shown, the combined signal 226*a* may also include additional signals that may be modulated to additional non-overlapping frequency bands. These additional signals may, for example, be generated by additional signal paths within the electronic circuit 200. The value of the modulated frequencies for each signal can be rearranged (e.g. the order of the signals as shown on the frequency spectrum graphs can be rearranged) as desired, so long as the frequency bands preferably do not overlap.

In an embodiment, the electronic circuit 200 may be configured to generate the combined signal 226*a* by combining signals having frequency spectrums that do not overlap. For example, the circuit path 208 may be configured to produce a signal or signals having a baseband frequency spectrum that falls within the frequency band FB1, the modulator circuit 216 may be configured to produce a signal having a frequency spectrum that falls within the frequency band FB2, and the modulator circuit 222 may be configured to produce a signal that falls within the frequency band FB3, which frequency bands do not overlap.

Figure 4:
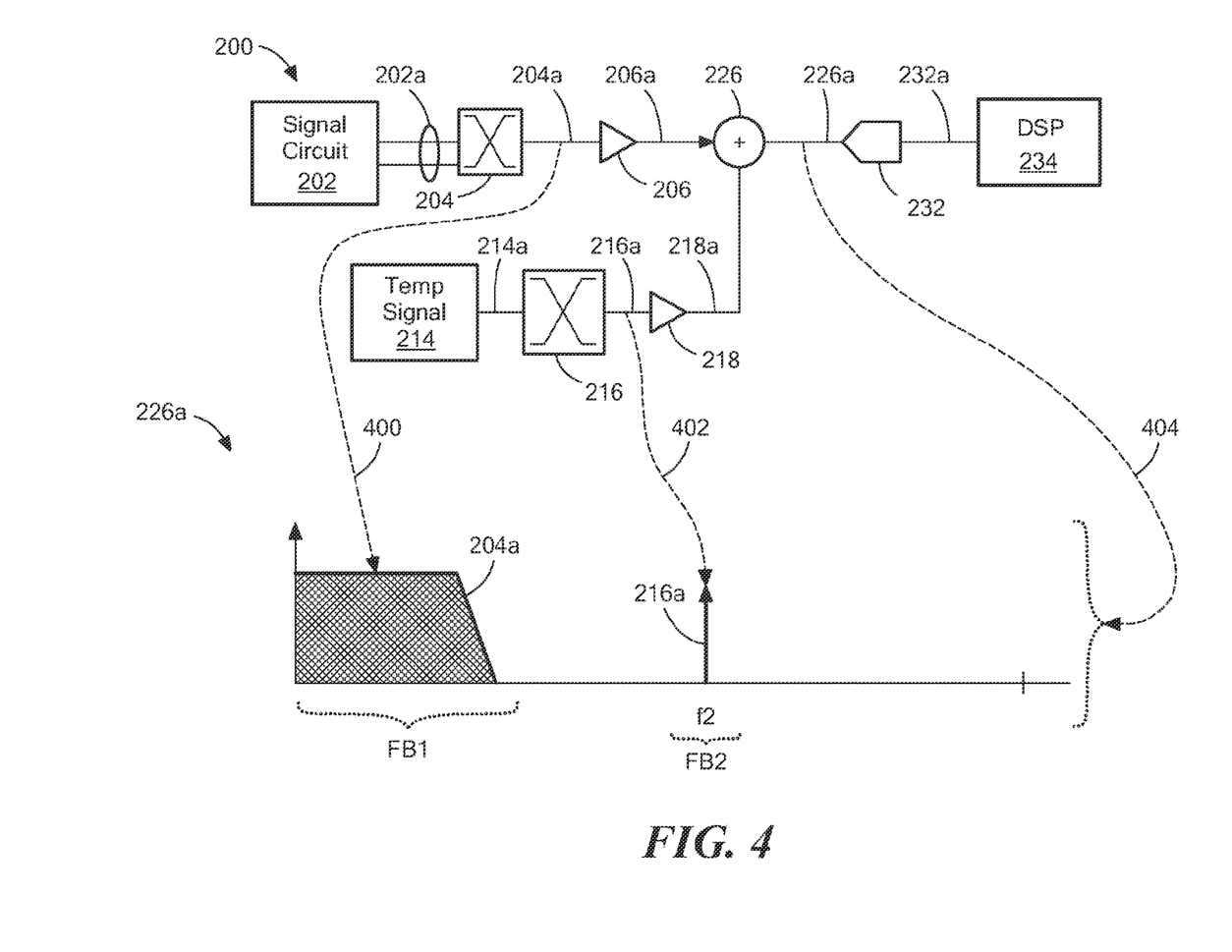
FIG. 4 is a diagram of an electronic circuit and a frequency spectrum.

For example, FIG. 4 includes a block diagram of the electronic circuit 200 and a frequency graph showing the combined signal 226*a*. As shown by the arrow 400, the baseband signal 202*a* may be generated by the magnetic field sensing circuit 202. Similarly, the arrow 402 indicates that the modulation circuit 216 may modulate the temperature signal 214*a* to produce the modulated temperature signal 216*a*, which may be modulated to the frequency f2 so that it falls within the frequency band FB2.

The arrow 404 indicates that the combined signal 226*a* produced by the adder circuit 226 comprises both the baseband signal 202*a* and the temperature signal 216*a*. If additional signals are generated by the electronic circuit 200, the combined signal 226*a* may also comprise the additional signals. (See, for example, the combined signal 226*a* as depicted in FIG. 3B).

Figure 5A:
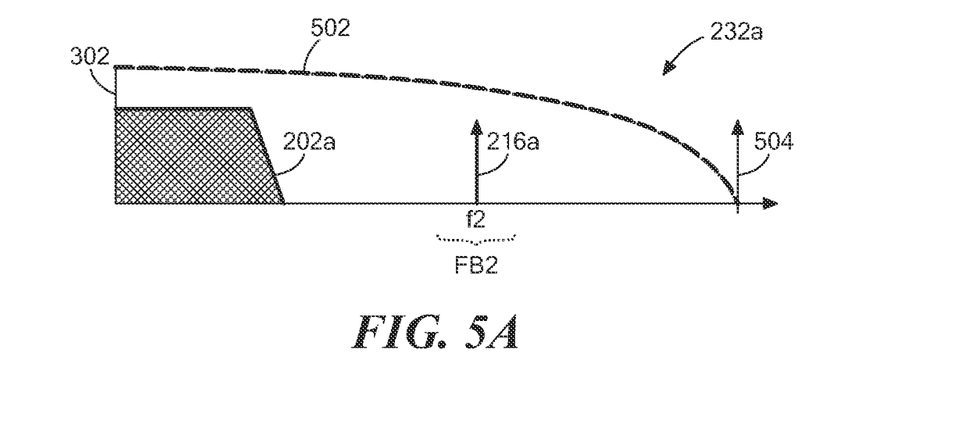
FIG. 5A, FIG. 5B, and FIG. 5C are frequency spectrums of a combined signal illustrating operations performed on the combined signal.
Figure 5B:
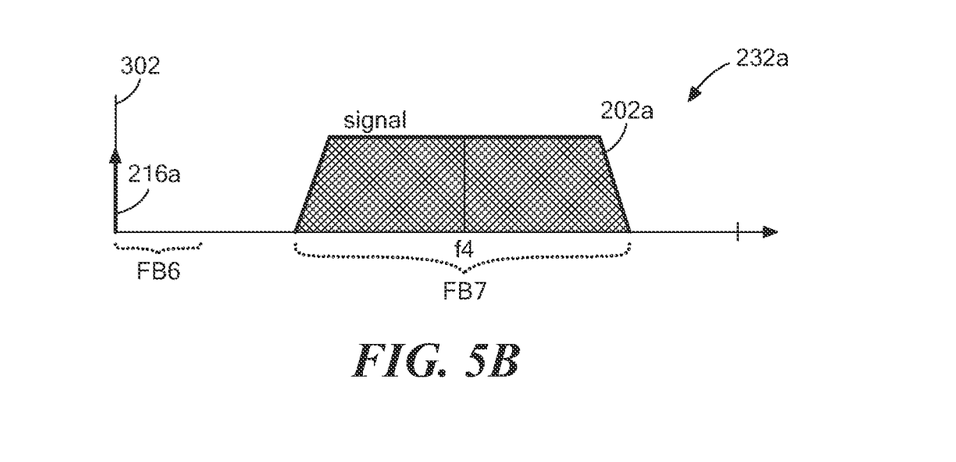
Figure 5C:
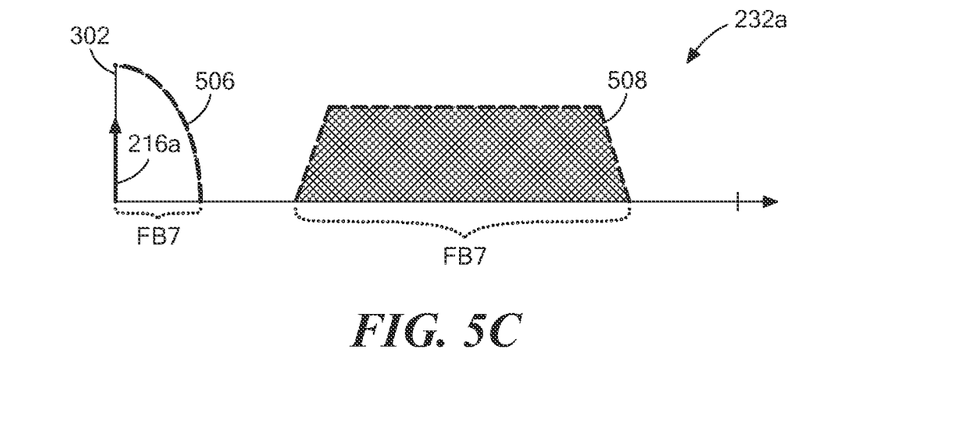

As noted above, the analog-to-digital converter (ADC) 232 may convert the combined signal 226*a* into a combined digital signal 232*a*. The DSP may act as a separation circuit—i.e. a circuit configured to separate or isolate component signals from the combined signal 232*a*. Once the combined digital signal 232*a* is received by the DSP 234, the DSP 234 may perform operations on the combined signal to separate or isolate component signals from the combined signal 232a. FIGS. 5A, 5B, and 5B provide an example of these operations.

FIG. 5A, FIG. 5B, and FIG. 5C are each frequency spectrum graphs where the horizontal axis represents frequency and the vertical axis represents an amplitude of the signal or data represented. In an embodiment, the vertical axis may represent a voltage level of the signal. Also, the arrow 302 represents the point on the graph where the frequency is zero.

FIG. 5A shows a filtering operation that may be performed by the DSP 234. In order to isolate the temperature signal 216a from the baseband signal 202a, the DSP 234 may first apply a low pass filter that removes any unwanted signals or data such as signal 504. The low pass filter transfer function is indicated by the curve 502, which defines a low-pass frequency range. Signals such as the signal 504 that fall outside of the curve may be removed or attenuated by the filtering operation. The signal 504 may be a measurement signal produced by a signal path such as signal path 212 (see FIG. 2). Although the signal 504 is depicted with a narrow frequency band, the signal 504 may also be a signal that has a wide frequency band, such as an unwanted noise signal. Also, multiple signals such as signal 504 may fall outside the transfer function 502 and may be attenuated by the filtering operation.

In an embodiment, the DSP 234 may apply a digital low-pass filter, for example a finite impulse response (FIR) filter, to the digital signal 232a to remove the unwanted signals and noise. The DSP 234 may also apply other types of low pass filters to the signal 232a. In an embodiment, if the signal 232a is an analog signal, an analog low-pass filter may be used to filter the signal 232a.

FIG. 5B shows a modulation operation that may be performed on the combined signal 232a by the DSP 234. The modulation operation may shift the temperature signal 216a from the frequency band FB2 to a baseband frequency band FB6. The modulation operation may also shift the baseband signal 202a away from the baseband frequency band FB6 to another frequency band FB7. In an embodiment, a center frequency f4 of the frequency band FB7 may be the same as or similar to the center frequency f2 of the frequency band FB2. However, this is not a requirement—the center frequency f4 may be any other frequency used to modulate the signal 204a. In an embodiment, the center frequency f4 may be a harmonic of the frequency f2.

The modulation operation illustrated by FIG. 5B may act to swap the frequency band of the baseband signal 202a and the frequency band of the temperature signal 216a so that the temperature signal 216a is at baseband. This may facilitate extraction of the temperature signal 216a from the combined signal 232a by allowing the temperature signal 216a to be isolated via a low pass filter described below.

FIG. 5C shows an example of a low pass filtering operation that may be performed by the DSP 234 to isolate or extract the temperature signal 216a from the combined digital signal 232a. The DSP 234 may apply a low-pass filter with a transfer function shown by the curve 506. The filter may be a low-pass filter that attenuates or removes signals that fall outside a frequency band FB8. By applying the low-pass filter, the DSP 234 may remove the baseband signal 202a from the combined signal 232a, as indicated by dotted line 508. These filtering and modulation operations may act to extract or separate the temperature signal 216a from the combined signal 232a because after the filtering and modulation operations, the only component signal that remains may be the temperature signal 216a, which has been shifted to a baseband frequency.

Although the description above discusses the DSP 234 performing operations on a digital combined signal 232a, an analog signal could also be used. For example, if the combined signal is an analog signal, analog filters and modulators can be used in place of the DSP 234 to extract the temperature signal 216a from the analog combined signal.

Additionally, although the example above uses low-pass filters, operations to extract the temperature signal 216a can be performed using other types of filters. For example, referring to FIG. 5A, a band pass filter that isolates the frequency band FB2 can first be applied to the combined signal 232a. This may isolate the temperature signal 216a from other signals within the combined signal 232a. The temperature signal 216a may then be shifted or modulated from frequency band FB2 to baseband.

Although the filtering and modulation operations are described as isolating the temperature signal 216a from the combined signal 232a, in other embodiments, the filtering and modulation operations may be used to extract other signals, such as signals produced by the signal path 212 in FIG. 2. Additionally, the filtering and modulation operations may be repeated, or additional filtering and modulation operations may be added, if the combined signal 232a comprises multiple signals. For example, if the combined signal 232a comprises the baseband signal 202a, the temperature signal 216a, and the magnetic field signal 224a, then additional filtering and modulation operations may be used to extract the temperature signal 216a, the signal 224a, and/or the baseband signal 202a from the combined signal 232a.

In embodiments, the baseband signal 202a may have information in multiple frequency bands. The frequency f2 of the modulated signal 216a may be chosen so that it does not overlap any of the frequency bands of the baseband signal 202a. The frequency f2 may fall between frequency bands of the baseband signal 202a, or it may fall outside of all the frequency bands of the baseband signal 202a. In such embodiments, a different filtering scheme having different or additional filtering operations may be used to extract the signal 216a from the combined signal 226a. In some instances, the signal 216a may, at least in part, overlap one of the bands of the baseband signal 202a. Alternative/additional filtering operations may be used to extract the signal 216a from the combined signal 226a in such cases.

Figure 6:
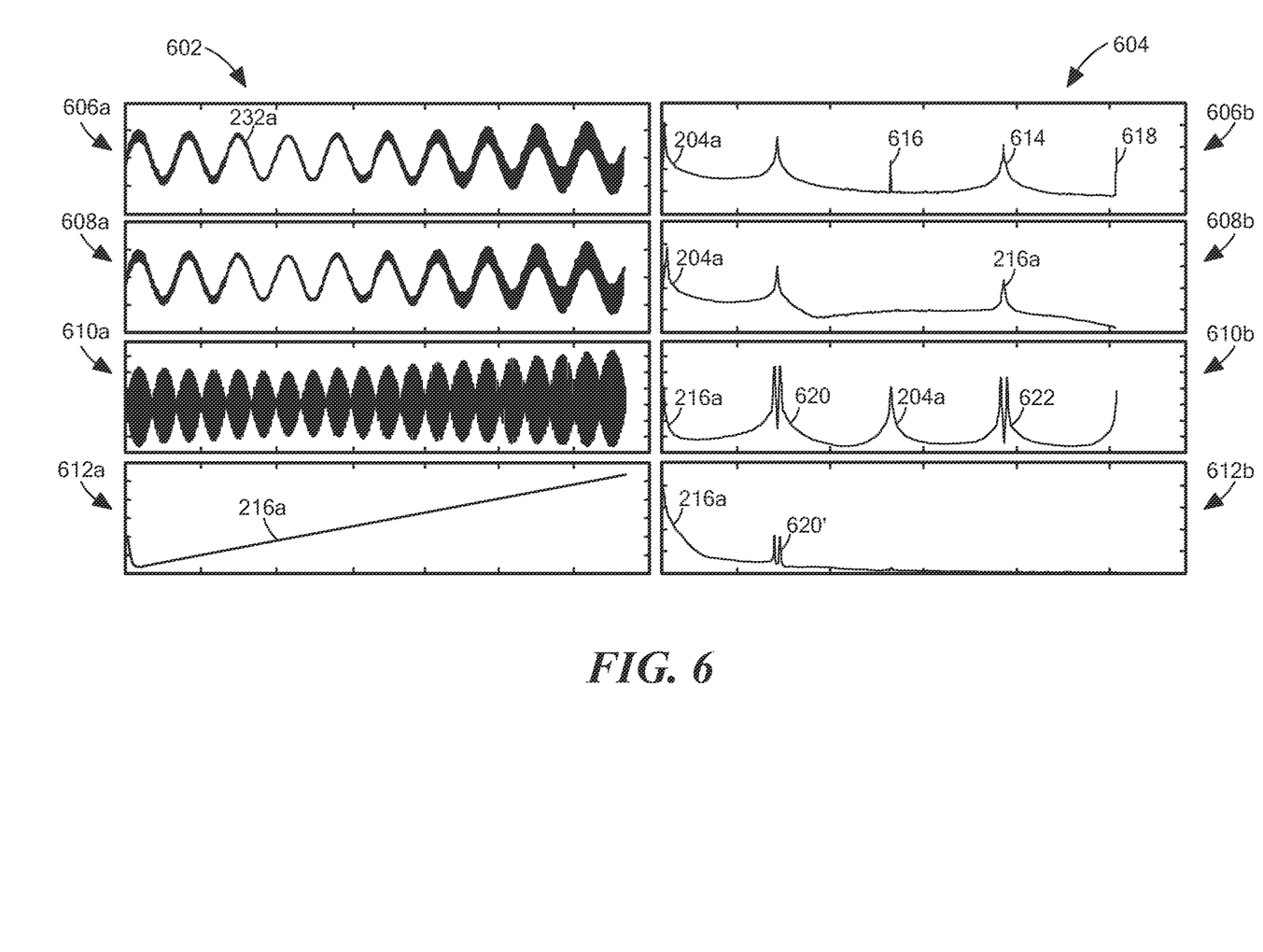
FIG. 6 is a series of graphs illustrating operations performed on a combined signal.

Turning now to FIG. 6, FIG. 6 is a series of waveforms that illustrate the process of extracting the temperature signal 216a from the combined signal 232a. In this example, the temperature was increased from approximately −30 degrees to approximately 60 degrees. Therefore, the temperature signal 216a, once extracted from the combined signal 232a, should be an increasing ramp.

In FIG. 6, the waveforms in left-hand column 602 are time-based waveforms having a horizontal axis that represents time, and the waveforms in right-hand column 604 are corresponding frequency spectrum waveforms having a horizontal axis that represents frequency. The frequency waveforms in right-hand column 604 are frequency-based representations of the waveforms in left-hand column 602.

Waveform 606a and frequency spectrum 606b is an example of a combined signal 232a. As shown in the frequency spectrum 606b, the combined signal 232a has a peak at or near baseband representing the baseband signal 202a. The combined signal 232a also has a peak at a higher frequency that represents the temperature signal 216a. The other peaks in waveform 606b (e.g. peaks 614, 616, and 618) may be noise, harmonics, or other disturbances within the combined signal 232a.

Waveform 608a and frequency spectrum 608b show the combined signal 232a after a filtering operation has been applied to the signal 232a. As shown, the peaks 616 and 618 have been removed from the combined signal 232a. Therefore, the filter applied may be a bandstop filter having notches at the frequencies of the peak 614 and 618, and/or a high pass filter for removing the peak 618.

Waveform 610a and frequency spectrum 610b show the combined signal 232a after a modulation operation of FIG. 5B has been applied to the signal 232a. As shown in waveform 610b, the modulation operation may shift the temperature signal 216a to baseband and shift the baseband signal 202a to a higher frequency. In some instances, the modulation operation may also introduce harmonics, shown by peaks 620 and 622.

Waveform 612a and frequency spectrum 612b show the combined signal 232a after a subsequent filtering operation of FIG. 5C has been applied to extract or isolate the temperature signal 216a. As shown in frequency spectrum 612b, the baseband signal 202a and the peak 622 have been filtered out and no longer appear in the frequency spectrum 612b. All that remains is the temperature signal 216a at baseband, and an attenuated peak 620'. As illustrated by the waveform 612a, the extracted temperature signal 216a is a temperature ramp from about −30 degrees to about 60 degrees.

Figure 7:
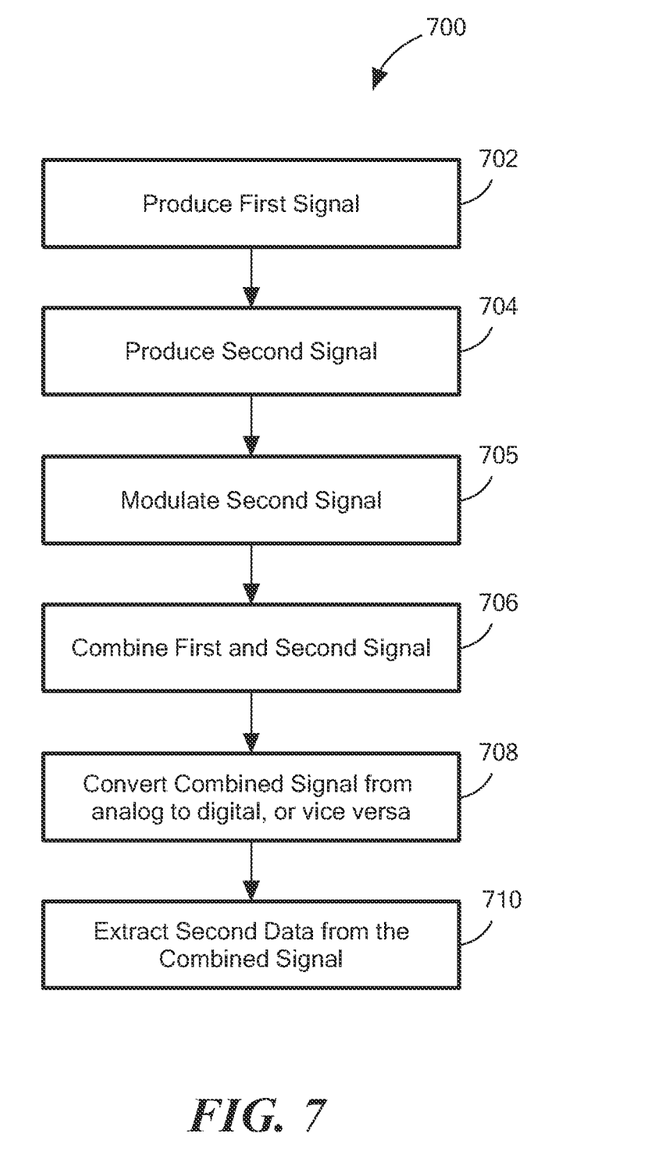
FIG. 7 is a flowchart of a process for extracting a signal from a combined signal.

FIG. 7 is a flowchart that illustrates a process 700 for isolating a temperature measurement. The process 700 may be implemented by an electronic circuit, such as the electronic circuit 200 shown in FIG. 2. In box 702, a first signal is produced. In an embodiment, the first signal may be indicative of a measurement of a magnetic field. In box 704 a second signal, such as a temperature signal, is produced. In box 705, the second signal may be modulated to a frequency that does not overlap the frequency band of the first signal. In box 706, the first signal and the second signal are combined to create a combined signal. In box 708, which may be an optional step as described above, the combined signal from an analog signal to a digital signal, or vice versa, depending upon whether the first and second signals are analog or digital. In box 710, the second signal is extracted from the combined signal. Although described as analog and digital signals in FIG. 7, as described above, any of the signals may be analog or digital.

The magnetic field sensor integrated circuit 200 may include a back-bias magnet as part of the integrated circuit package for producing a magnetic field, the strength of which is represented by the magnetic field signal. Various configurations and fabrication techniques are known for providing a magnetic field sensor with a back bias magnet. For example, molded back bias magnets are described in a U.S. Pat. No. 6,692,676 and other types of back bias magnets and package arrangements are described in a U.S. Pat. No. 6,265,865, both of such U.S. patents being assigned to the assignee of the subject application and being incorporated herein by reference.

Figure 8:
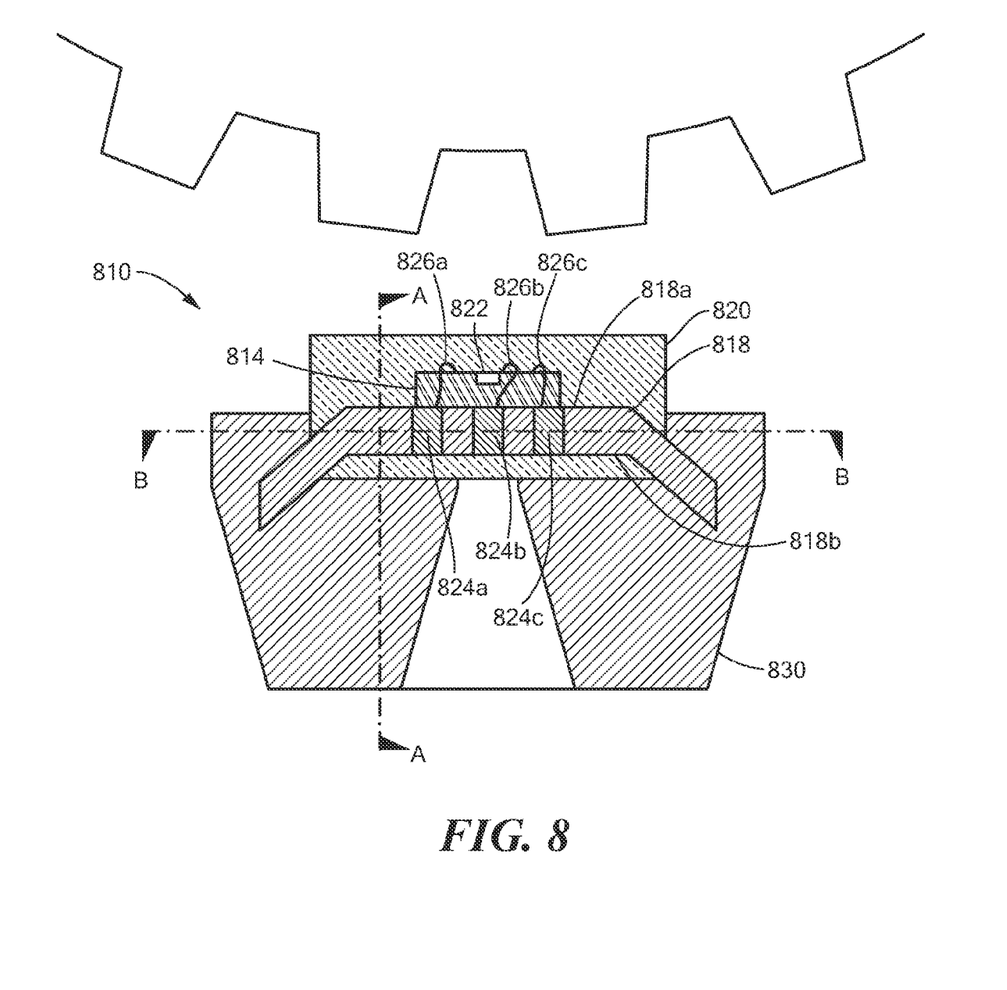
FIG. 8 is an illustration of an integrated circuit package.

One illustrative packaged magnetic field sensor integrated circuit 810 including a molded back bias magnet 830 is shown in FIG. 8 to include a magnetic field sensing element 822 formed on a semiconductor die 814, which die is attached to a die attach portion 818a of a lead frame 18. The lead frame 818 includes a plurality of leads 824a, 824b, and 824c that may be coupled to the die, such as with wire bonds 826a, 826b, and 826c as shown. The die 814 and at least a portion of the lead frame 818 may be enclosed by a non-conductive mold material 820. A second, ferromagnetic mold material may be coupled to a portion of the first mold material, such as with a securing mechanism in the form of barbs 818b, to form a back bias magnet. To this end, the ferromagnetic mold material 830 may comprise a hard ferromagnetic material. One or both of the first and/or second mold materials 820, 830 can be fabricated by various techniques, such as transfer or injection molding, or potting.

In some embodiments, the second mold material 830 is molded apart from the magnetic field sensor 202. In other embodiments, the second mold material 830 is molded directly upon the magnetic field sensor 202. In an embodiment, the magnetic mold material is not required to have a constant cross section. In other words, the magnetic mold material may have cutouts, holes, or notches depending upon the design.

As a target 832 moves into or out of the magnetic field created by the magnetic mold material, the magnetic field sensor integrated circuit 810 may sense perturbations in the magnetic field. These sensed perturbations may be used to create a signal that represents proximity, speed, or position of the target 832.

In an embodiment, the apparatus and processes described may be used to reduce the circuitry and hardware required to measure signals. Referring again to FIG. 1, prior art systems require redundant components, such as redundant ADC 16 and ADC 24, in each signal path. By combining signals into a combined signal and subsequently extracting signals from the combined signals, redundant components may not be needed. For example, as shown in FIG. 2, only one ADC 232 is required for multiple signal paths 208, 210, and 212.

Embodiments of the invention may be implemented by circuitry, hardware, software, or a combination thereof. In an embodiment, software instructions may be stored in a memory, such as a RAM, ROM, EEPROM, hard drive, DVD disk, CD disk, fused ROM, or any other type of volatile or non-volatile memory. The software instructions, when executed by a processor, may cause the processor to perform all or some of the operations described above. For example, in an embodiment, the DSP 234 (see FIG. 2) may be a digital signal processor that receives software instructions from a memory that cause the DSP 234 to perform filtering and modulation operations as described above.

The embodiments described above include digital and analog signals and components. These signals are provided as examples only. Signals described above as analog may be replaced by equivalent digital signals, and vice versa, if desired. Similarly, components and circuits described above as analog may be replaced by equivalent digital circuits and components, and vice versa.

The figures are provided as examples of various embodiments, and are not intended to limit the scope of the disclosure. For example, components and connections within block diagrams and schematics can be rearranged, replaced, added, removed, or replaced with equivalent or analogous components and connections as desired and still fall within the scope of the disclosure. Similarly, blocks and connections within flowcharts can be rearranged, replaced, added, removed, or replaced with equivalent or analogous blocks and connections and remain within the scope of the disclosure. Additionally, flowcharts do not necessitate any particular order of operation; the order of flow within a flowchart can be altered within the scope of the disclosure.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A method of producing a temperature signal, comprising:
producing a magnetic field signal having a frequency spectrum, wherein the magnetic field signal is responsive to a magnetic field;
producing a temperature signal;
modulating the temperature signal to a frequency outside the frequency spectrum of the magnetic field signal resulting in a first modulated signal;
combining the magnetic field signal with the first modulated signal to produce a combined signal.

2. The method of claim 1 wherein modulating the temperature signal includes modulating at a frequency that is about twice a maximum frequency of the magnetic field signal.

3. The method of claim 1 wherein the combining the magnetic field signal with the first modulated signal includes summing the magnetic field signal and the first modulated signal to produce the combined signal.

4. The method of claim 1 wherein the magnetic field signal is a signal for detecting speed or position of a target object and a width of the frequency spectrum is defined by the speed of the target object.

5. The method of claim 4 wherein the target object is a wheel having teeth, and peaks on the magnetic field signal represent a proximity of the teeth to a magnetic field sensing element.

6. The method of claim 1 wherein producing the temperature signal includes monitoring a current passing through a PN junction.

7. The method of claim 6 wherein the PN junction is part of a diode or BJT transistor.

8. The method of claim 7 wherein the diode or BJT transistor is part of a circuit that is not specifically designed to measure temperature.

9. The method of claim 1 further comprising extracting data representing the temperature signal from the combined signal.

10. The method of claim 9 wherein the extracting comprises:
modulating the combined signal to shift the data representing the temperature signal to a baseband frequency, resulting in a second modulated signal; and
applying a filter to the second modulated signal to separate the data representing the temperature signal from the second modulated signal.

11. The method of claim 9 further comprising converting the combined signal to a digital signal prior to extracting the data.

12. The method of claim 11 wherein the converting the combined signal to the digital signal includes producing the digital signal with an analog-to-digital converter that comprises a bandwidth sufficiently large to process the combined signal.

13. An apparatus comprising:
a circuit configured to produce a magnetic field signal having a frequency spectrum, wherein the magnetic field signal is responsive to a magnetic field external to the apparatus;
a temperature sensing circuit configured to produce a temperature signal;
a first modulation circuit configured to modulate the temperature signal to a frequency outside the frequency spectrum of the magnetic field signal, resulting in a first modulated signal; and
a combining circuit configured to combine the magnetic field signal with the first modulated temperature signal to produce a combined signal.

14. The apparatus of claim 13 wherein the temperature sensing circuit is configured to modulate the temperature signal at a frequency that is about twice a maximum frequency of the magnetic field signal.

15. The apparatus of claim 13 wherein the combining circuit comprises a summation circuit configured to sum the magnetic field signal and the modulated temperature signal to produce the combined signal.

16. The apparatus of claim 13 further comprising an analog-to-digital converter having bandwidth sufficiently large to process the combined signal.

17. The apparatus of claim 13 further comprising a separation circuit configured to separate data representing the temperature signal from the combined signal to produce a temperature reading.

18. The apparatus of claim 17 wherein the separation circuit comprises one or more of:
a second modulation circuit configured to shift the data representing the temperature signal to a baseband frequency, resulting in a second modulated signal; and
a filter coupled to receive the second modulated signal and configured to separate the data representing the temperature signal from the second modulated signal.

19. The apparatus of claim 13 wherein the circuit configured to produce the magnetic field signal is a circuit for detecting speed or position of a target object and a width of the frequency spectrum is defined by the speed of the target object.

20. The apparatus of claim 19 further comprising a magnetic field sensing element, wherein the target object is a wheel having teeth, wherein peaks on the magnetic field signal are produced as the teeth of the wheel move past the magnetic field sensing element.

21. The apparatus of claim 13 wherein the temperature sensing circuit comprises a PN junction.

22. The apparatus of claim 21 wherein the PN junction is part of a diode or BJT transistor.

23. The apparatus of claim 22 wherein the diode or BIT transistor is part of a circuit that is not specifically designed to measure temperature.

24. A method of sensing temperature comprising:
producing a first signal having a frequency spectrum, wherein the first signal is responsive to a magnetic field;
producing a second signal responsive to a temperature;
modulating the second signal to a frequency outside the frequency spectrum of the first signal resulting in a first modulated signal;
combining the first signal with the first modulated signal to produce a combined signal; and
extracting the second signal from the combined signal.

25. The method of claim 24 wherein the second signal is: a temperature signal, a stress signal, a magnetic field signal, a measurement signal, or a combination thereof.

* * * * *